US007557046B1

(12) United States Patent
Veliadis

(10) Patent No.: US 7,557,046 B1
(45) Date of Patent: Jul. 7, 2009

(54) SYSTEMS AND METHODS FOR INTERCONNECT METALLIZATION USING A STOP-ETCH LAYER

(75) Inventor: John V. Veliadis, Midlothian, VA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 130 days.

(21) Appl. No.: 11/584,990

(22) Filed: Oct. 23, 2006

(51) Int. Cl.
*H01L 21/302* (2006.01)
*H01L 21/461* (2006.01)

(52) U.S. Cl. .................. 438/740; 438/618; 257/E21.17; 257/E21.091; 257/E21.218; 257/E21.229; 257/E21.246

(58) Field of Classification Search .................. 438/618, 438/680, 683, 679, 706, 712, 745, 740, 931
See application file for complete search history.

(56) References Cited

U.S. PATENT DOCUMENTS

| 4,974,055 | A | * | 11/1990 | Haskell | 257/742 |
| 5,324,673 | A | * | 6/1994 | Fitch et al. | 438/156 |
| 5,736,457 | A | * | 4/1998 | Zhao | 438/624 |
| 6,294,460 | B1 | * | 9/2001 | Subramanian et al. | 438/636 |
| 6,756,319 | B2 | * | 6/2004 | Kim | 438/761 |
| 6,998,204 | B2 | * | 2/2006 | Furukawa et al. | 430/5 |

* cited by examiner

*Primary Examiner*—David Nhu
(74) *Attorney, Agent, or Firm*—Fulbright & Jaworski L.L.P.

(57) ABSTRACT

Systems and methods for single lithography step interconnection metallization using a stop-etch layer are described. A method comprises depositing a stop-etch layer over a semiconductor device, depositing an interconnect metallization material over the stop-etch layer, performing a single lithography step to pattern a mask over the interconnect metallization material, etching the interconnect metallization material in non-masked areas, and removing the stop-etch layer. A system comprises means for depositing the stop-etch layer over a wafer, means for depositing an interconnected metallization layer over the chrome layer, means for patterning a mask over the interconnect metallization layer, means for etching the interconnect metallization layer, where the etching stops at the stop-etch layer, and means for removing the stop-etch layer.

29 Claims, 10 Drawing Sheets

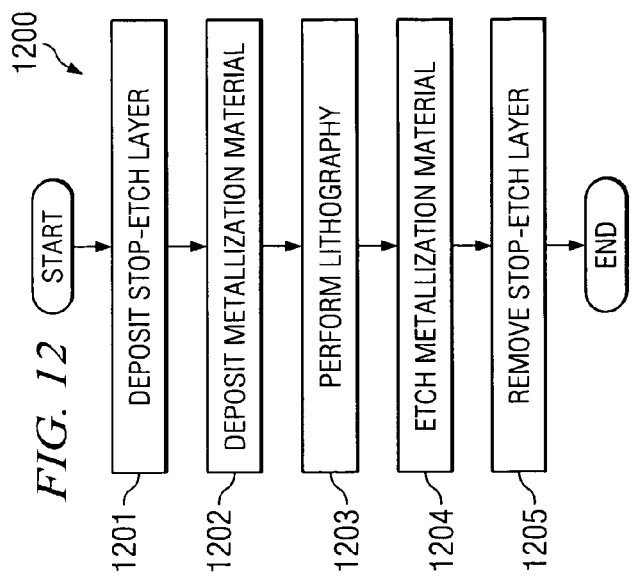
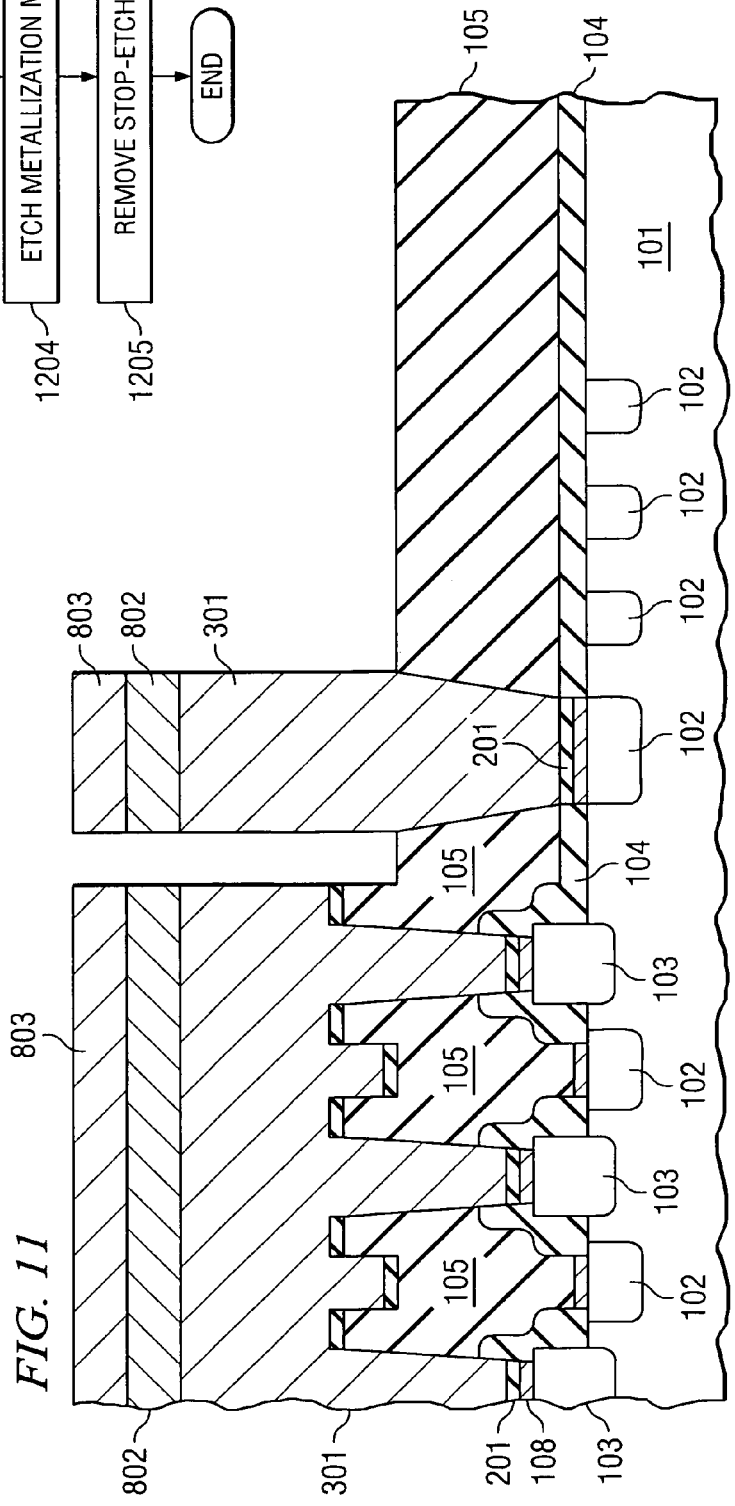

SYSTEMS AND METHODS FOR INTERCONNECT METALLIZATION USING A STOP-ETCH LAYER

STATEMENT REGARDING FEDERALLY SPONSORED RESEARCH OR DEVELOPMENT

The invention was made in part with Government support by the Army Research Laboratory under government contract number: DAAD17-03-C-0140. The Government has certain rights in the invention.

TECHNICAL FIELD

The present invention relates generally to semiconductor technology and, more particularly, to interconnect metallization using a stop-etch layer.

BACKGROUND OF THE INVENTION

Fabrication of electronic circuits may be divided into two stages. In the first stage, active and passive devices are fabricated on the wafer surface. In the second stage, metal systems necessary to connect these devices are added to the chip. The various processes for connecting these component parts together are generally referred to as "metallization."

The inventor hereof has recognized that, particularly in power and radio frequency (RF) semiconductor devices, the coefficient of thermal expansion (CTE) of the interconnect metal should closely match that of the underlying semiconductor material in order to avoid catastrophic metal failures due to the expansion from the intense heat that is generated during operation of such devices. However, the CTEs of gold (Au), aluminum (Al), Copper (Cu), Nickel (Ni), and platinum (Pt), which are commonly used as interconnect metals, do not match those of certain semiconductor materials, such as Silicon Carbide (SiC) and Gallium Nitride (GaN).

Moreover, the inventor hereof has also recognized that prior-art metallization processes frequently result in non-uniformity across the wafer and/or die, and that such processes are often subject to machine and operator errors which are inherent to prior-art etching methods.

BRIEF SUMMARY OF THE INVENTION

Embodiments of the present invention are directed to systems and methods that reduce or eliminate device failure due to thermally induced metal fatigue, particularly in SiC and GaN-based devices. For example, a stop-etch layer (e.g., chrome (Cr)) may be deposited over a wafer surface followed by the deposition of interconnect metallization material (e.g., a mixture of titanium (Ti), titanium tungstate (TiW), titanium nitride (TiN), Molybdenum (Mo), and tungsten (W)) over the stop-etch layer. Preferably, at least one of the stop-etch layer and the interconnect metallization material have a CTE matched to that of the underlying semiconductor material. In one embodiment, a lithography operation may etch dielectric deposited on top of the CTE matched interconnect metal layers, thereby forming a dielectric mask or pattern. In another embodiment, a lithography operation may place resist material over certain areas of the CTE matched interconnect metal layers, thereby forming a resist mask or pattern. In another embodiment, additional interconnect metal layers can be deposited (e.g., gold (Au), platinum (Pt), aluminum (Al), copper (Cu), nickel (Ni), chrome (Cr)), with the top metal layer of the metallization stack chosen to stop etch chemicals. The portion of the additional interconnect metal layers situated on top of resist areas may then be lifted off by resist removal, thus forming a metal mask or pattern that stops the etch and protects the layers underneath it from etching action. Subsequently, the interconnect metallization material may be etched from the non-resist-mask, the non-dielectric-mask, or the non-metal-mask covered areas, with the etching stopping at the stop-etch layer. Finally, the stop-etch layer may be removed from the non-resist-mask, the non-dielectric-mask, or the non-metal-mask covered areas, thus producing the desired interconnect metallization pattern.

Some of the methods and systems described herein protect against the non-uniformity that is characteristic of prior-art etching processes. Moreover, certain embodiments of the present invention allows purposeful "over etching" of the metallization material in order to guarantee uniformity across different areas of the wafer and/or die. Other embodiments also safeguard against machine and/or operator errors inherent to prior-art "stop-watch" etching methods. Moreover, embodiments of the present invention further provide a method for a single lithographic step interconnect metallization that may use W (or a mixture of Ti, TiN, TiW, Mo and W) as the metallization material, thus resulting in the fabrication of more reliable SiC and GaN-based semiconductor devices. Many other advantages and benefits of the invention will be readily recognized by a person of ordinary skill in the art in light of this disclosure.

The foregoing has outlined rather broadly certain features and technical advantages of the present invention so that the detailed description that follows may be better understood. Additional features and advantages are described hereinafter. As a person of ordinary skill in the art will readily recognize in light of this disclosure, specific embodiments disclosed herein may be utilized as a basis for modifying or designing other structures for carrying out the same purposes of the present invention. Such equivalent constructions do not depart from the spirit and scope of the invention as set forth in the appended claims. Several inventive features described herein will be better understood from the following description when considered in connection with the accompanying figures. It is to be expressly understood, however, the figures are provided for the purpose of illustration and description only, and are not intended to limit the present invention.

BRIEF DESCRIPTION OF THE DRAWINGS

For a more complete understanding of the present invention, reference is now made to the following drawings, in which:

FIGS. 8-11 are cross-sectional views illustrating processing steps for a semiconductor device where a metal mask or pattern is formed; and FIG. 12 is flowchart illustrating an interconnect metallization method using a stop-etch layer.

DETAILED DESCRIPTION OF THE INVENTION

In the following description, reference is made to the accompanying drawings that form a part hereof, and in which exemplary embodiments of the invention may be practiced by way of illustration. These embodiments are described in sufficient detail to enable a person of ordinary skill in the art to practice the invention, and it is to be understood that other embodiments may be utilized, and that changes may be made, without departing from the spirit of the present invention. The following description is, therefore, not to be taken in a limited sense, and the scope of the present invention is defined only by the appended claims.

Single lithographic step interconnect metallization systems and methods are disclosed herein representing exemplary embodiments of the present invention. Although certain embodiments discussed below utilize an Ion-implanted Static-Induction-Transistor (SIT) for illustration purposes, a person of ordinary skill in the art will readily recognize that the present invention is not limited to the fabrication of this particular device and may, in fact, be used in the fabrication of any semiconductor device. Moreover, while examples illustrated below may indicate specific materials and dimensions, a person of ordinary skill in the art will also recognize that certain variations and modifications may be made without departing from the spirit and scope of the present invention.

Figure 1:
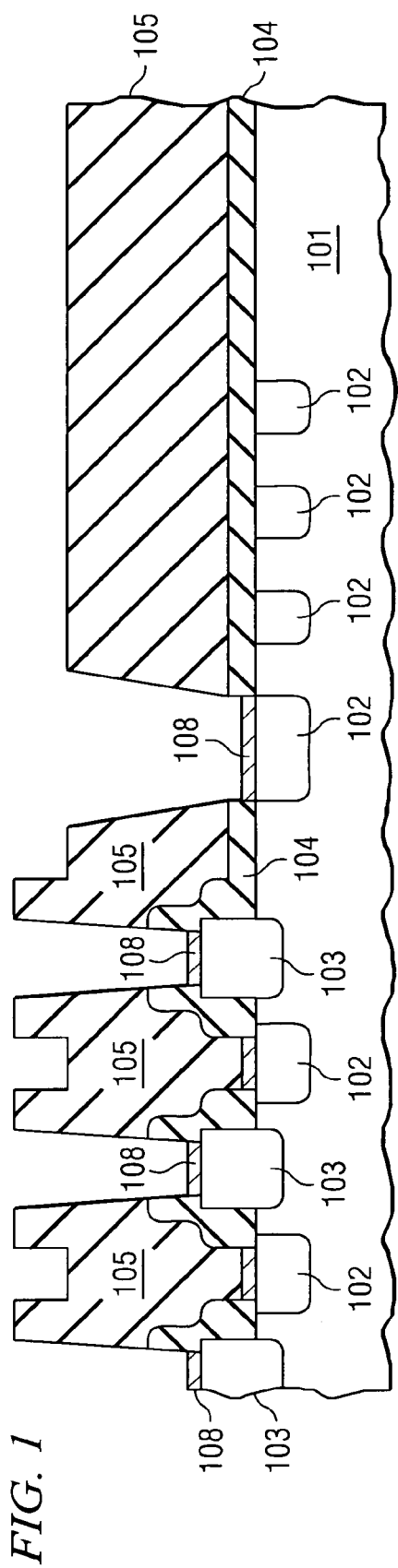
FIG. 1 is a cross-sectional view illustrating a semiconductor device prepared for interconnect metallization.

FIG. 1 shows a semiconductor device prepared for metallization, according to an exemplary embodiment of the present invention. Substrate and epitaxy 101 has several p+ and n+ doped regions 102 and 103, respectively. First dielectric layer 104 is located over substrate or epitaxy 101, and one or more dielectric layers 105 are located over first dielectric layer 104. Any number of dielectric layers (including zero) 105 may be present. In one exemplary embodiment, substrate and epitaxy 101 may be silicon carbide (SiC) or gallium nitride (GaN). Additional dielectric layers 105 may be, for instance, phosphosilicate glass or PSG (i.e., silica ($SiO_2$)), silicon nitride (i.e. $Si_3N_4$), thermally grown oxide, and tetraethyl orthosilicate deposited $SiO_2$ (i.e. TEOS deposited $SiO_2$), whereas first dielectric layer 104 may be, for instance, borophosphosilicate glass or BPSG. In this example, source and gate metallization layers 108 are also shown. Areas 106 and 107 over the gate-bus region and n+ source fingers of the SIT, respectively, are open to receive interconnect metallization.

Figure 2:
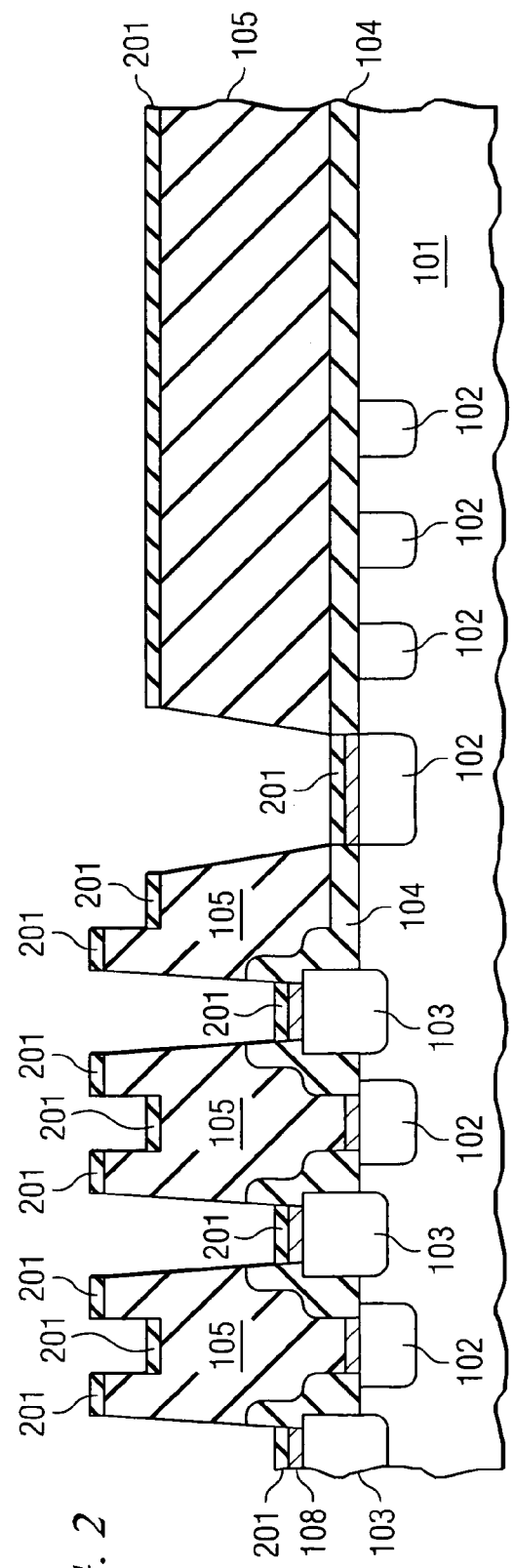
FIG. 2 is a cross-sectional view illustrating a semiconductor device with a stop-etch layer deposited over the device.

FIG. 2 shows the semiconductor device of FIG. 1 with stop-etch layer 201, according to an exemplary embodiment of the present invention. In one exemplary embodiment, a layer of chrome (Cr) is deposited by physical-vapor-deposition (e.g., evaporation, e-beam evaporation, sputtering), or by chemical-vapor-deposition over the wafer, thereby creating stop-etch layer 201. Preferably, stop-etch layer 201 has a CTE matched to that of the underlying semiconductor material. Layer 201 may, for example, have a thickness of about 200 A. Further, layer 201 may be capable of stopping sulfur hexafluoride (SF6) from etching portions of the device that are covered by it during a subsequent reactive-ion-etching (RIE) step. Layer 201 may also be designed to protect covered regions from other etching processes and/or agents.

Figure 3:
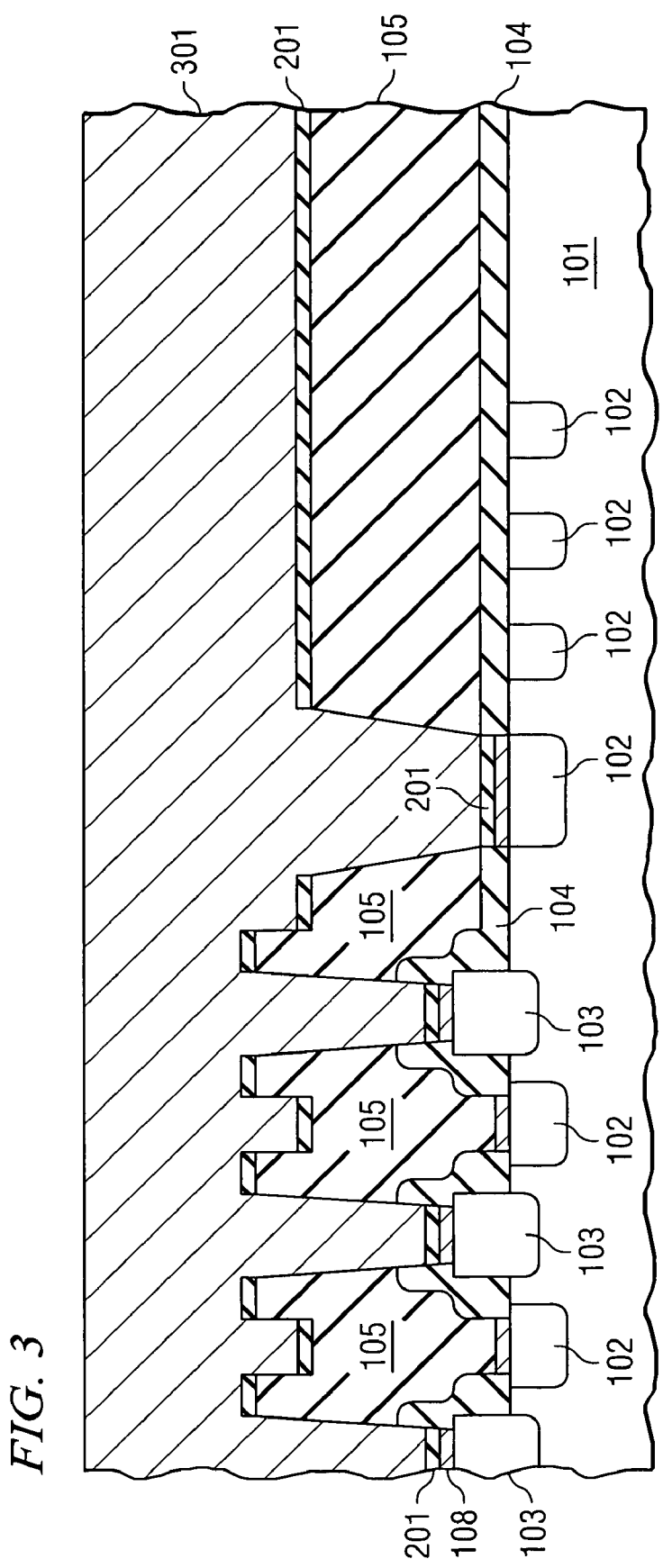
FIG. 3 is a cross-sectional view illustrating a semiconductor device with a layer of interconnect metallization material deposited over the stop-etch layer.

FIG. 3 shows the semiconductor device of FIG. 2 with a layer of interconnect metallization material 301 deposited over stop-etch layer 201, according to an exemplary embodiment of the present invention. For example, metallization material 301 may comprise titanium (Ti), tungsten (W), titanium nitride (TiN), titanium tungsten (TiW), molybdenum (Mo), or any combination thereof. In one exemplary embodiment, metallization material 301 is a mixture of titanium, nitrogen, and tungsten. Preferably, layer 301 has a CTE matched to that of the underlying semiconductor material. The thickness of metallization material layer 301 may vary according to the type of metallization material and/or deposition method used. For instance, when tungsten is chosen as metallization material, chemical-vapor deposition (CVD) may be used to create a W (17000 A) layer. In another example, physical-vapor-deposition (PVD or "sputtering") may be used to create a Ti (200 A) layer or a TiW (1000 A) layer.

In one exemplary embodiment of the present invention, a lithography and a dielectric etch operation may pattern dielectric material over certain areas of the CTE matched interconnect metal layers, thereby forming a dielectric mask or pattern. In another embodiment, a lithography operation may place resist material over certain areas of the CTE matched interconnect metal layers, thereby forming a resist mask or pattern. There exemplary embodiments are described below with respect to FIGS. 4-7, where layer 401 may be a dielectric or a resist material. In yet another exemplary embodiment, interconnect metal layers may be deposited in addition to resist material, where the top metal layer of the metallization stack may be selected to stop etch chemicals. This exemplary embodiment is described below with respect to FIGS. 8-11.

Figure 4:
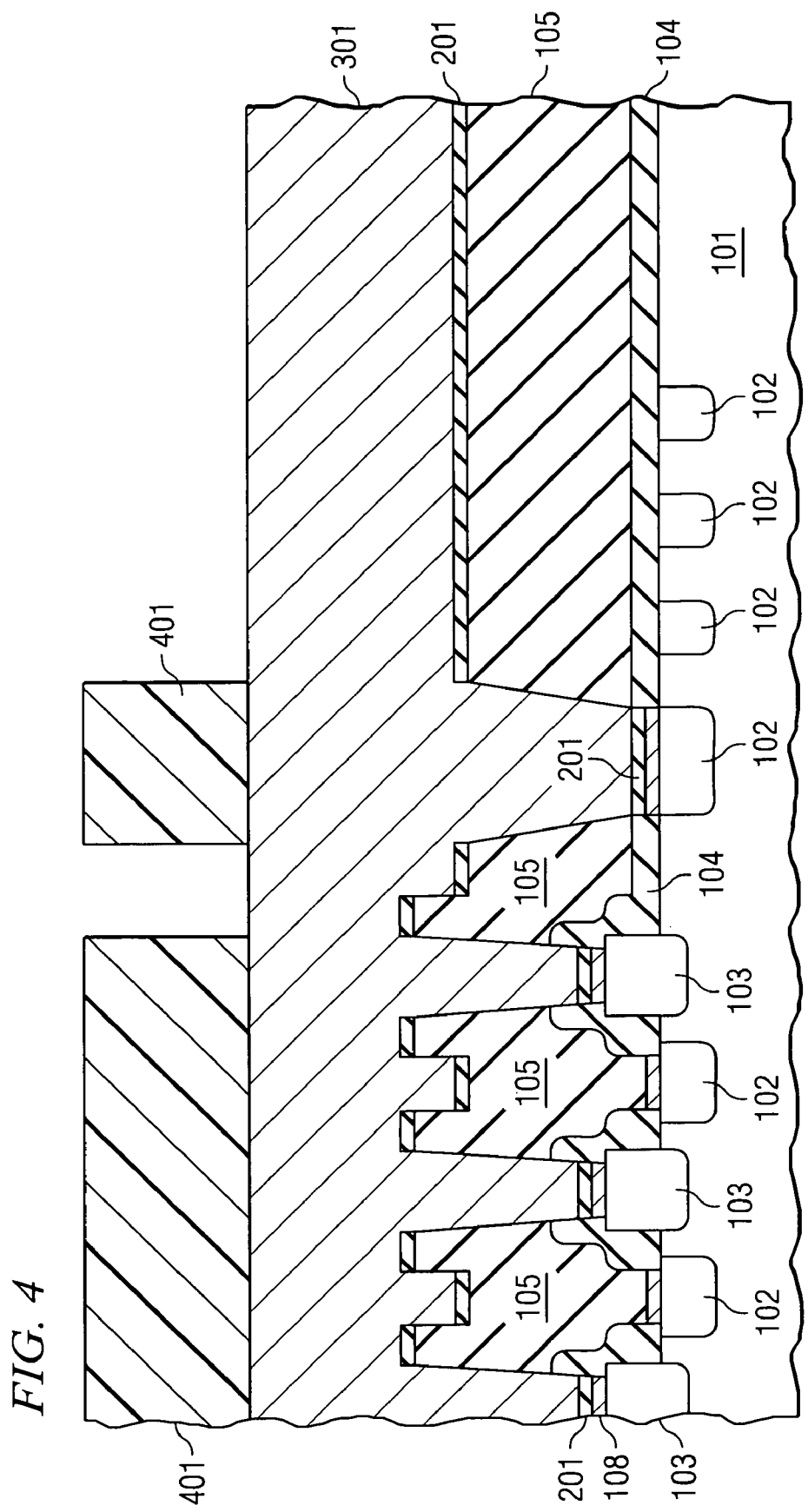
FIGS. 4-7 are cross-sectional views illustrating processing steps for a semiconductor device where a resist mask or pattern, or a dielectric mark or pattern are formed.
Figure 5:
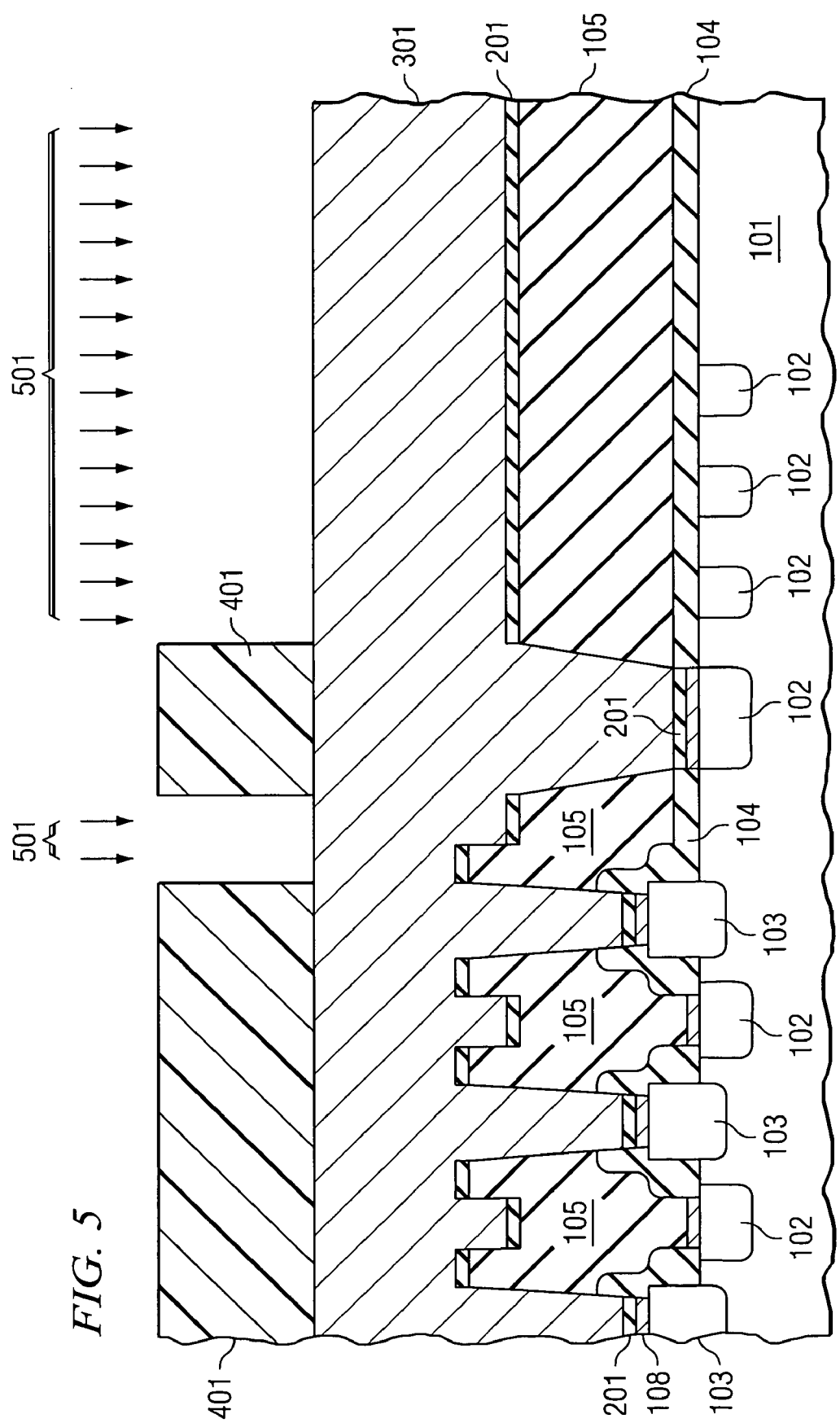
Figure 6:
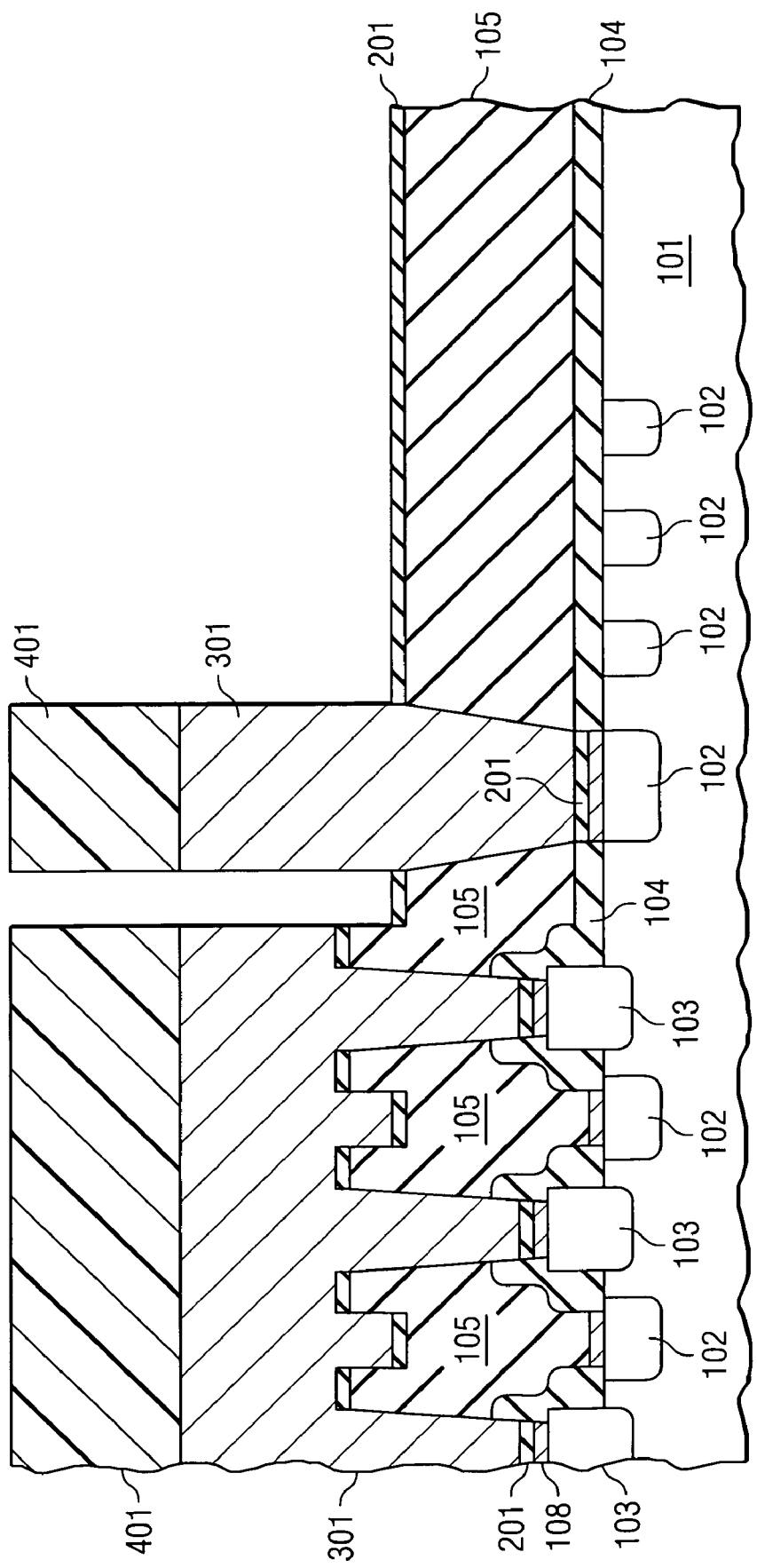
Figure 7:
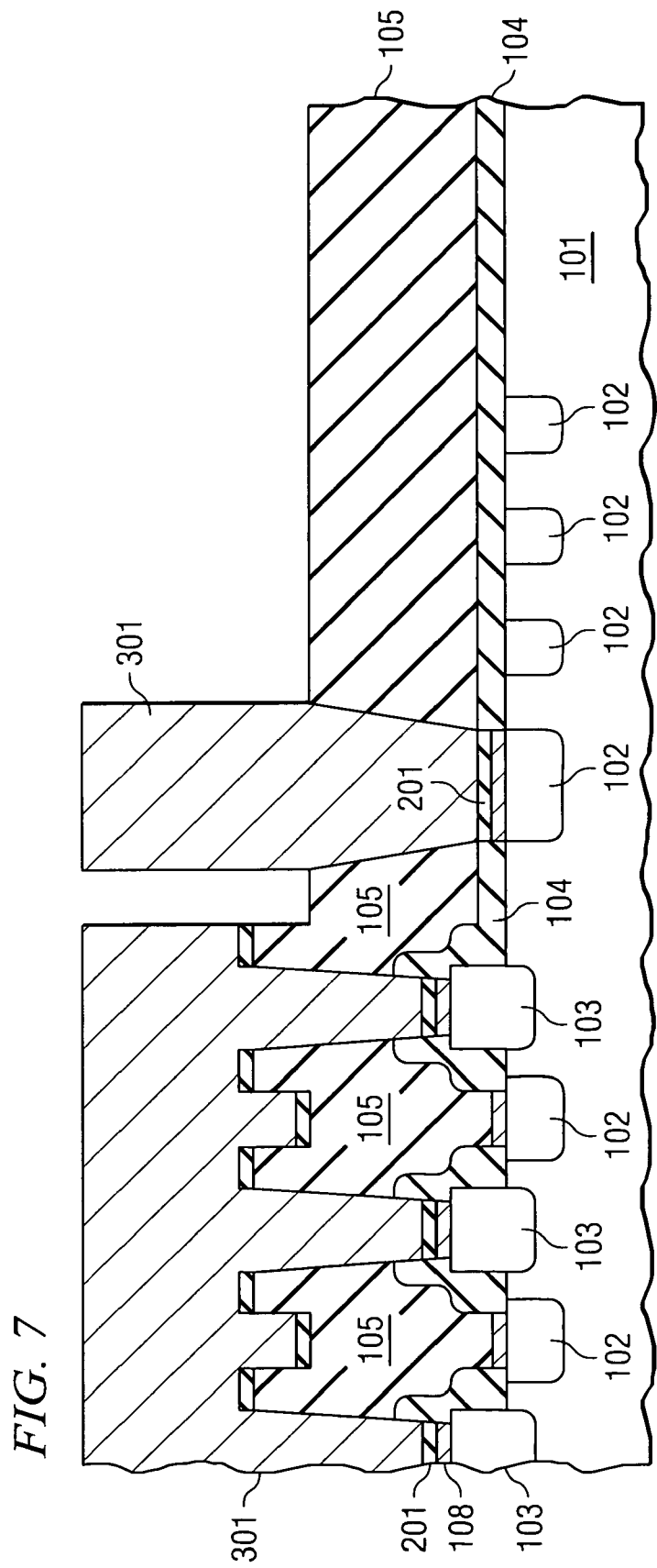

Turning now to FIGS. 4-7, cross-sectional views illustrating processing steps for a semiconductor device where a resist mask or a dielectric mask is formed are provided according to exemplary embodiments of the present invention. FIG. 4 shows the semiconductor device of FIG. 3 with patterned resist or dielectric layer 401, which may block action by etching agents. FIG. 5 shows the semiconductor device of FIG. 4 under etching process 501 that may be, for example, a reactive-ion-etching (RIE) process, a wet chemical etching process, or a dry chemical etching process. FIG. 6 shows the semiconductor device of FIG. 5 after interconnect metallization material 301 has been uniformly etched in non-resist or non-dielectric covered areas. An etching agent such as, for example, sulfur hexafluoride (SF6), may be blocked by stop-etch layer 201, thus protecting dielectric layer 105 and underlying layers from being undesirably etched. FIG. 7 shows the semiconductor device of FIG. 6 where resist or dielectric layer 401 and stop-etch layer 201 have been removed, for instance, with a chemical dip or exposure of the wafer to a very high energy RF process.

Figure 8:
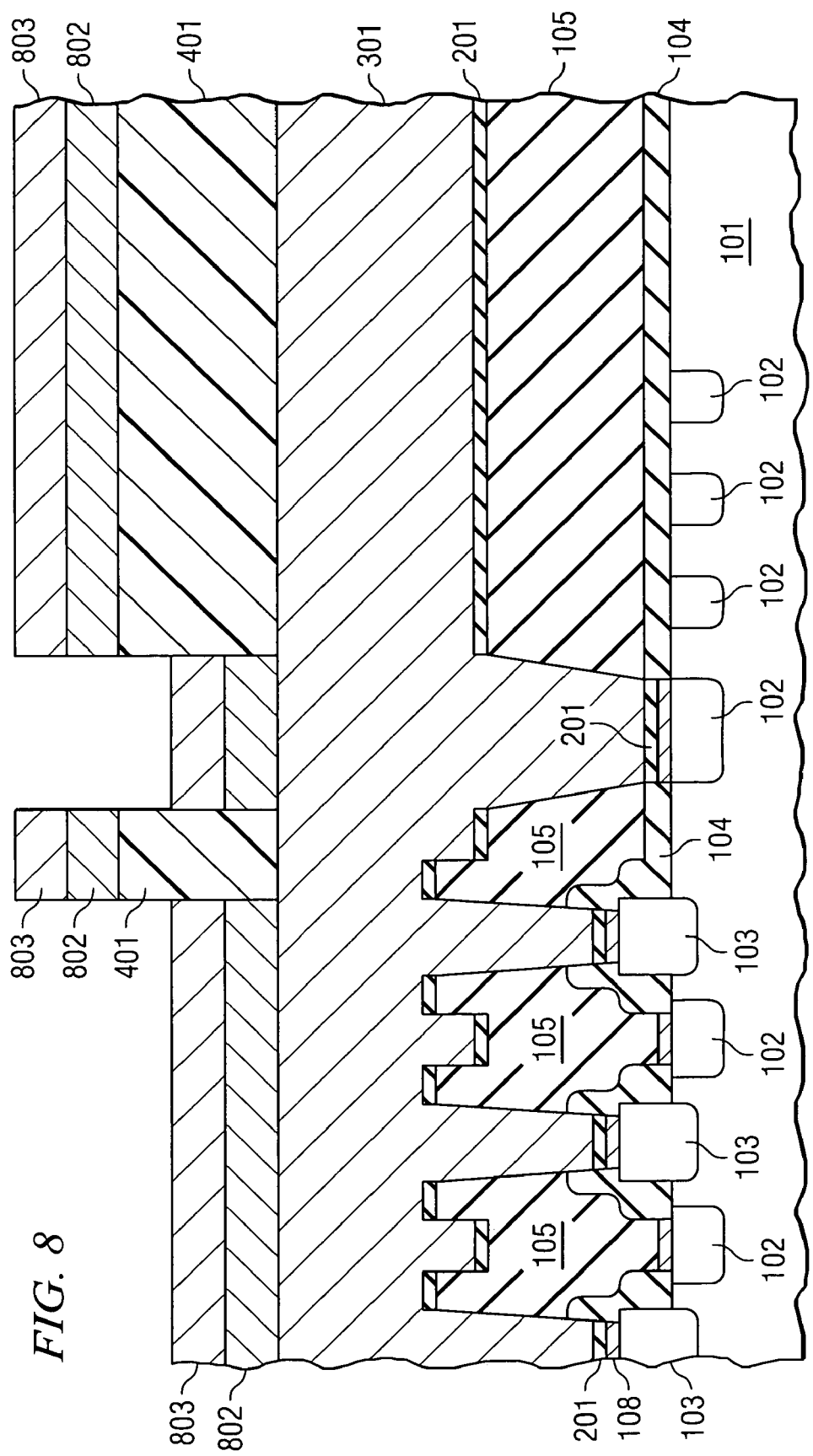
Figure 9:
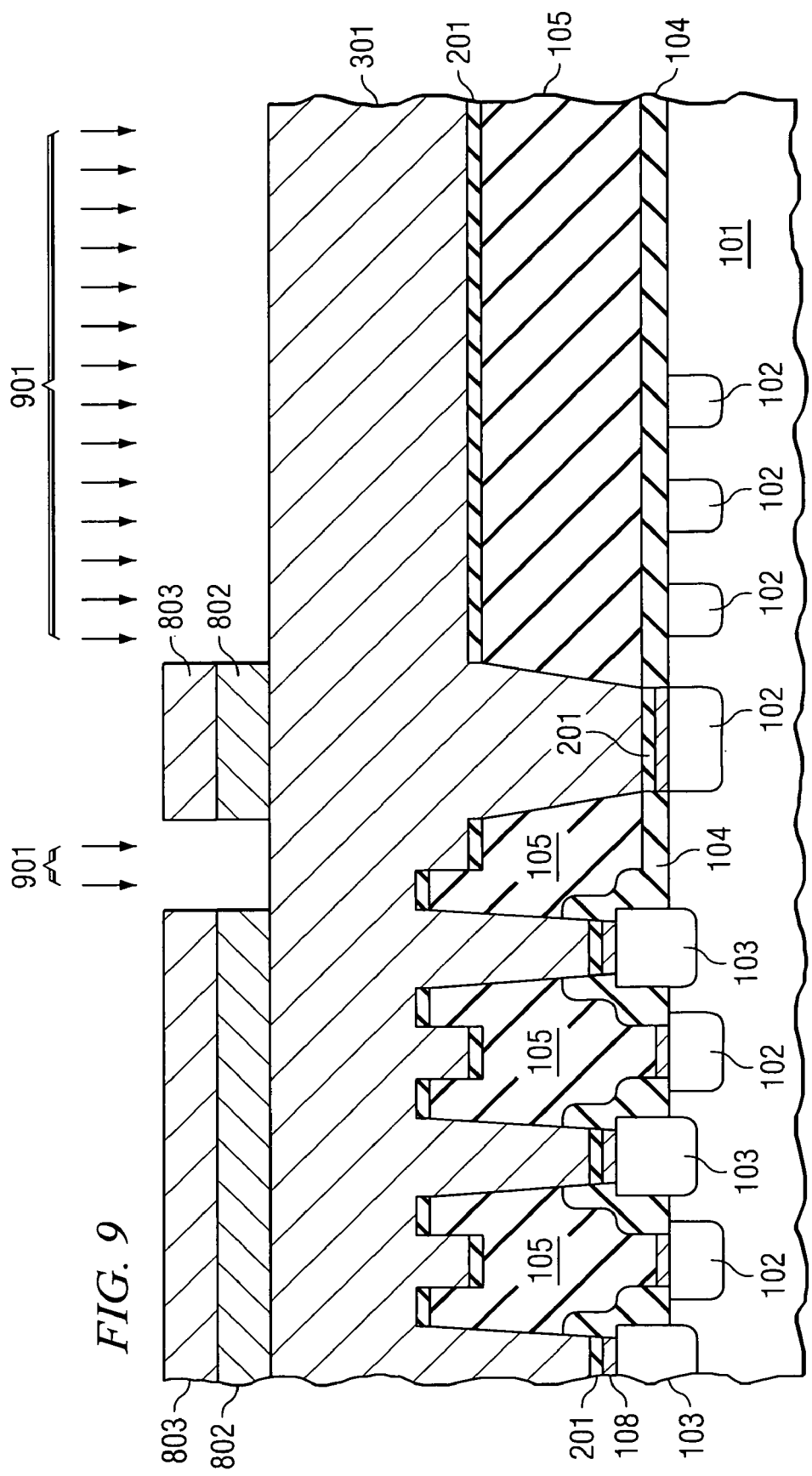
Figure 10:
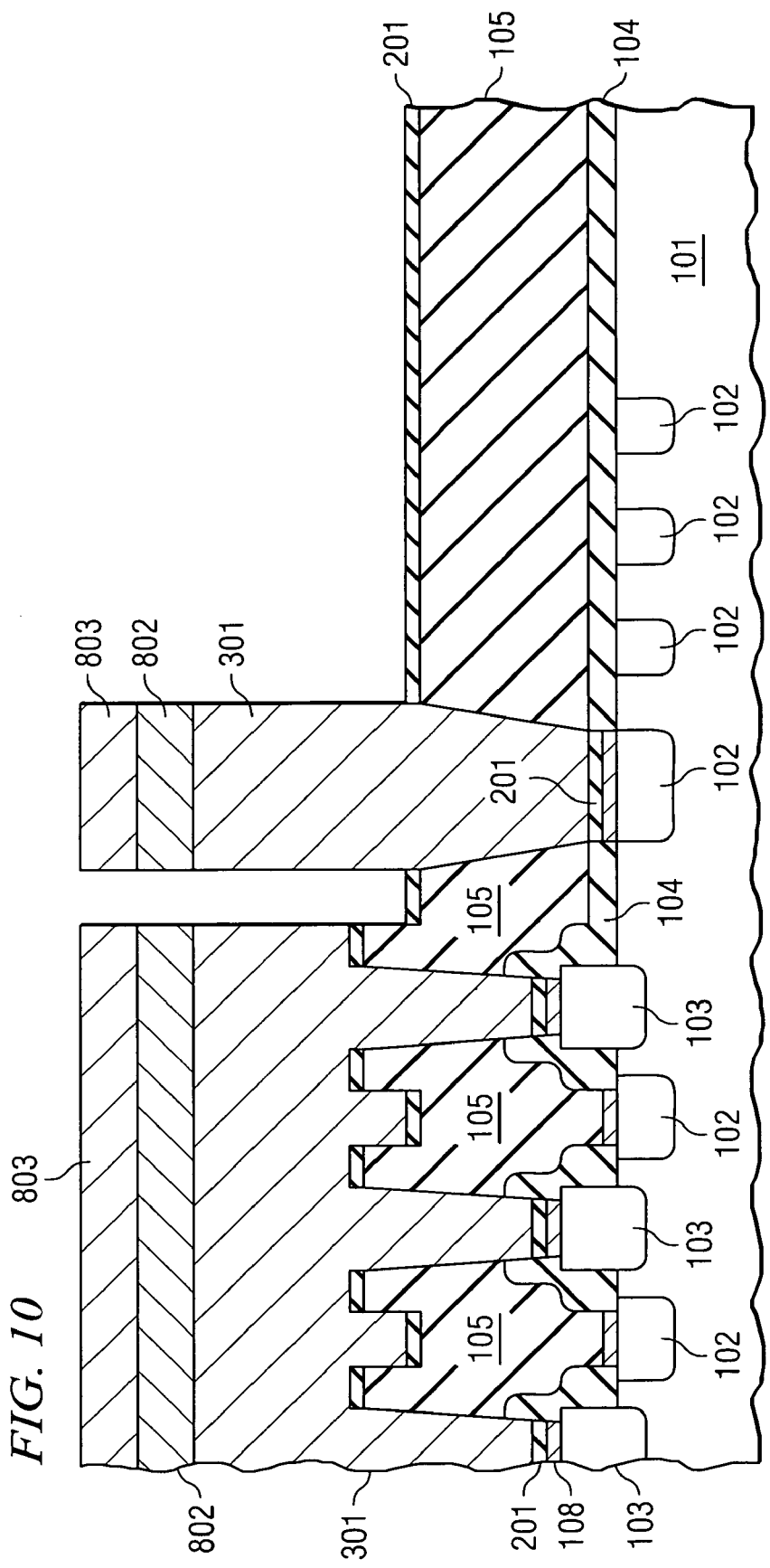

With respect to FIGS. 8-11, cross-sectional views illustrating processing steps for a semiconductor device where a metal mask is formed are provided according to exemplary embodiments of the present invention. FIG. 8 shows the semiconductor device of FIG. 3 with patterned resist 401 and layers of material 802 and 803, which may be deposited, for example, by physical vapor deposition (e.g., evaporation, e-beam evaporation, sputtering) or chemical vapor deposition. Resist 401 may be patterned onto the device in a lithographic step. Layers 802 (e.g., Ti/Pt) and 803 (e.g., Au) may be evaporated. In one exemplary embodiment, layer 803 is optional. In another embodiment, Ti/Pt layer 802 and/or Au layer 803 forms a metal mask which may block action by etching agents. FIG. 9 shows the semiconductor device of FIG. 8 after lift-off and under an etching process 901 that may be, for example, a reactive-ion-etching (RIE) process, a wet chemical etching process, or a dry chemical etching process. FIG. 10 shows the semiconductor device of FIG. 9 after interconnect metallization material 301 has been uniformly etched in non-metal-mask covered areas. Again, an etching agent may be blocked by stop-etch layer 201, thus protecting dielectric layer 105 and underlying layers from being undesirably etched. FIG. 11 shows the semiconductor device of FIG. 10 where stop-etch layer 201 has been removed, for instance, with a chemical dip or exposure of the wafer to an RF process.

As described above, FIGS. 7 and 11 show the semiconductor devices of FIGS. 4 and 8, respectively, with the resulting interconnect metallization. The present invention reduces the number of necessary processing steps in the fabrication process because it requires a single lithographic step and only one or zero corresponding metal lift-off steps depending on the desired composition of interconnect metal layers. Moreover, the present invention permits that the wafer be "over etched," either purposefully (e.g., to achieve uniformity) or as a result of inadvertent mistake, without damage to the underlying wafer, die, and/or device. The stop-etch layer is later removed, thus resulting in a uniformly etched wafer.

FIG. 12 shows a flowchart of a single lithography step interconnect metallization method using a stop-etch layer according to one embodiment of the present invention. In step 1201, a layer of stop-etch material (e.g., chrome (Cr)) is deposited over a wafer, thereby creating a stop-etch layer that is capable of stopping an etching process and/or etching agent from reaching the device. A layer of interconnect metallization material is deposited over the stop-etch layer in step 1202. In step 1203, a dielectric material is patterned over the interconnect metallization material. In another embodiment, a resist material is patterned over the interconnect metallization material in step 1203. In yet another embodiment, this lithography step is accompanied by the deposition of at least one metal layer (e.g., Ti/Pt, Au, Al, Cu, Ni, Cr, etc.) and a lift-off. In step 1204, an etching process is used to remove interconnect metallization material in non-covered areas of the wafer. Finally, in step 1205, the stop-etch layer is removed, thus resulting in the desired interconnect metallization.

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the process, machine, manufacture, means, methods, and steps described herein. As a person of ordinary skill in the art will readily appreciate from this disclosure, other processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

What is claimed is:

1. A method for performing a single lithography step interconnect metallization using a stop-etch layer comprising:
   depositing a stop-etch layer over the entire surface of a semiconductor device;
   depositing an interconnect metallization material over the stop-etch layer;
   performing a single lithography step to pattern a mask over the interconnect metallization material;
   etching the interconnect metallization material in non-masked areas to form a hole through the interconnect metallization material, where the etching is blocked by the stop-etch layer; and
   partially removing the stop-etch layer from said semiconductor device.

2. The method for performing a single lithography step interconnect metallization using a stop-etch layer according to claim 1, where the stop-etch layer is a chrome layer.

3. The method for performing a single lithography step interconnect metallization using a stop-etch layer according to claim 2, where depositing the stop-etch layer includes evaporating chrome over the wafer.

4. The method for performing a single lithography step interconnect metallization using a stop-etch layer according to claim 1, where the interconnect metallization material has a first coefficient of thermal expansion that closely matches a second coefficient of thermal expansion of a semiconductor material underlying the semiconductor device.

5. The method for performing a single lithography step interconnect metallization using a stop-etch layer according to claim 4, where the semiconductor material is selected from the group consisting of silicon carbide and gallium nitride.

6. The method for performing a single lithography step interconnect metallization using a stop-etch layer according to claim 1, where the stop-etch layer material has a third coefficient of thermal expansion that closely matches a second coefficient of thermal expansion of a semiconductor material underlying the semiconductor device.

7. The method for performing a single lithography step interconnect metallization using a stop-etch layer according to claim 6, where the semiconductor material is selected from the group consisting of silicon carbide and gallium nitride.

8. The method for performing a single lithography step interconnect metallization using a stop-etch layer according to claim 1, where the interconnect metallization material is tungsten.

9. The method for performing a single lithography step interconnect metallization using a stop-etch layer according to claim 8, where the tungsten is chemical-vapor-deposited over the stop-etch layer.

10. The method for performing a single lithography step interconnect metallization using a stop-etch layer according to claim 1, where the interconnect metallization material is a mixture of titanium, nitrogen, and tungsten.

11. The method for performing a single lithography step interconnect metallization using a stop-etch layer according to claim 10, where the mixture of titanium, nitrogen, and tungsten is sputtered over the stop-etch layer.

12. The method for performing a single lithography step interconnect metallization using a stop-etch layer according to claim 1, where etching the interconnect metallization material comprises using a reactive-ion-etching process.

13. The method for performing a single lithography step interconnect metallization using a stop-etch layer according to claim 1, where etching the interconnect metallization material comprises using a wet chemical etching process.

14. The method for performing a single lithography step interconnect metallization using a stop-etch layer according to claim 1, where etching the interconnect metallization material comprises using a dry chemical etching process.

15. The method for performing a single lithography step interconnect metallization using a stop-etch layer according to claim 1, further comprising over etching the interconnect metallization material for a time sufficient to assure uniformity across a wafer.

16. The method for performing a single lithography step interconnect metallization using a stop-etch layer according to claim 1, further comprising over etching the interconnect metallization material for a time sufficient to assure uniformity across a die.

17. The method for performing a single lithography step interconnect metallization using a stop-etch layer according to claim 1, where removing the stop-etch layer comprises performing a chemical dip.

18. The method for performing a single lithography step interconnect metallization using a stop-etch layer according to claim 1, where removing the stop-etch layer comprises exposing the semiconductor device to a radio frequency (RF) process.

19. The method for performing a single lithography step interconnect metallization using a stop-etch layer according to claim 1, where the semiconductor device is a power device.

20. The method for performing a single lithography step interconnect metallization using a stop-etch layer according to claim 1, wherein the semiconductor device is a radio frequency (RF) device.

21. A method for performing a single lithography step interconnect metallization using a stop-etch layer, comprising:
   depositing the stop-etch layer over the entire surface of a wafer;
   depositing an interconnect metallization layer over the stop-etch layer;
   performing a mask over the interconnect metallization layer;
   etching the interconnect metallization layer to form a hole through the interconnect metallization layer, where the etching stops at the stop-etch layer; and
   partially removing the stop-etch layer from the wafer.

22. The method for performing a single lithography step interconnect metallization using a stop-etch layer according to claim 21, where the stop-etch layer comprises a chrome layer.

23. The method for performing a single lithography step interconnect metallization using a stop-etch layer according to claim 21, where the interconnect metallization layer comprises a material selected from the group consisting of tungsten and molybdenum.

24. The method for performing a single lithography step interconnect metallization using a stop-etch layer according to claim 21, where the mask is selected from the group consisting of: a dielectric mask, a resist mask, and a metal mask.

25. The method for performing a single lithography step interconnect metallization using a stop-etch layer according to claim 21, where the wafer comprises a semiconductor material selected from the group consisting of silicon carbide and gallium nitride.

26. The method for performing a single lithography step interconnect metallization using a stop-etch layer according to claim 21, further comprising over etching the interconnect metallization layer for a time sufficient to assure uniformity across the wafer.

27. The method for performing a single lithography step interconnect metallization using a stop-etch layer according to claim 1, where the mask is selected from the group consisting of: a dielectric mask, a resist mask, and a metal mask.

28. The method for performing a single lithography step interconnect metallization using a stop-etch layer according to claim 27, where the mask is a metal mask and said metal mask remains as part of the semiconductor device once patterned over the interconnect metallization material.

29. The method for performing a single lithography step interconnect metallization using a stop-etch layer according to claim 24, where the mask is a metal mask and said metal mask remains as part of the wafer once patterned over the interconnect metallization layer.

* * * * *

UNITED STATES PATENT AND TRADEMARK OFFICE
CERTIFICATE OF CORRECTION

PATENT NO. : 7,557,046 B1
APPLICATION NO. : 11/584990
DATED : July 7, 2009
INVENTOR(S) : John V. Veliadis It is certified that error appears in the above-identified patent and that said Letters Patent is hereby corrected as shown below:

In the Claims:

Column 7, Claim 21, Line 21, delete the portion of text reading "performing a mask" and replace with --patterning a mask--.

Signed and Sealed this

Eighteenth Day of August, 2009

David J. Kappos
*Director of the United States Patent and Trademark Office*